United States Patent
Hasegawa et al.

(10) Patent No.: US 8,029,918 B2
(45) Date of Patent: Oct. 4, 2011

(54) BRAZING METHOD AND BRAZED STRUCTURE

(75) Inventors: Tsuyoshi Hasegawa, Minamikawachi-gun (JP); Masaaki Ishio, Osaka (JP); Shunji Kajikawa, Ama-gun (JP); Yoshitsugu Sakamoto, Toyohashi (JP); Takayuki Hayashi, Nagoya (JP)

(73) Assignee: Neomax Materials Co., Ltd., Osaka (JP)

( * ) Notice: Subject to any disclaimer, the term of this patent is extended or adjusted under 35 U.S.C. 154(b) by 0 days.

(21) Appl. No.: 12/829,413

(22) Filed: Jul. 2, 2010

(65) Prior Publication Data

US 2010/0273025 A1    Oct. 28, 2010

Related U.S. Application Data

(62) Division of application No. 10/596,715, filed as application No. PCT/JP2004/019197 on Dec. 22, 2004.

(30) Foreign Application Priority Data

Dec. 24, 2003    (JP) .................. 2003-426713

(51) Int. Cl.
*B32B 15/18* (2006.01)
*B32B 15/20* (2006.01)
*F28F 21/08* (2006.01)

(52) U.S. Cl. ........ 428/675; 428/677; 428/679; 428/685; 165/905

(58) Field of Classification Search .................. None
See application file for complete search history.

(56) References Cited

U.S. PATENT DOCUMENTS

2007/0224445 A1 *  9/2007  Hasegawa et al. ............ 428/660

FOREIGN PATENT DOCUMENTS

| EP | 1068924 | * | 1/2001 |
| JP | 2001-001133 | * | 1/2001 |
| JP | 2003-145290 | * | 5/2003 |

OTHER PUBLICATIONS

English language translation of JP 2003-145290. May 2003.*
Hasegawa et al.; "Diffusion Brazing Method Using a Diffusion Supressing Layer"; U.S. Appl. No. 10/596,715, filed Jun. 22, 2006.

* cited by examiner

*Primary Examiner* — John J Zimmerman
(74) *Attorney, Agent, or Firm* — Keating & Bennett, LLP

(57) ABSTRACT

A brazing method includes assembling a first member and a second member, the first member including a base plate made of a ferrous material and a diffusion suppressing layer laminated on the base plate and made of a Ni—Cr alloy including more than about 15% and less than about 40% of Cr, the second member being disposed on the first member with a brazing material of a Cu—Ni alloy including more than about 10% and less than about 20% of Ni therebetween, and maintaining the temporary assembly at a temperature of more than about 1,200° C. to fuse the brazing material and diffuse Ni atoms and Cr atoms into the fused brazing material to form the braze joint, causing the resulting brazing material to have an increased melting point due to the Ni and Cr contents of the braze joint to self-solidify the braze joint, and then cooling the resulting assembly.

6 Claims, 4 Drawing Sheets

BRAZING METHOD AND BRAZED STRUCTURE

BACKGROUND OF THE INVENTION

1. Field of the Invention

The present invention relates to a brazing method which produces a braze joint having excellent corrosion and oxidation resistances, and also relates to a brazed structure produced by the brazing method.

2. Description of the Background Art

With a globally growing interest in environmental issues, there has recently been an increasing demand for cleaning diesel engine emission gas. For the emission gas cleaning, an attempt has been made to suppress generation of $NO_x$ by EGR (emission gas recycling) in which a portion of the emission gas is passed through a heat exchanger for reducing the temperature of the emission gas and introduced into an engine for reducing the oxygen concentration of the intake gas, and heat generated by combustion is absorbed by the emission gas having a higher specific heat to reduce the combustion temperature.

The heat exchanger is produced by brazing members which are made of such material as a stainless steel and are to be joined to each other with the intervention of a braze joint formed by fusing and solidifying a brazing material. A copper brazing material having a melting point of not lower than 1,000° C. and having excellent corrosion resistance is typically used as the brazing material.

A clad material has recently been proposed as a material for the members to be joined for improving the corrosion resistance of the braze joint. As disclosed in JA-3350667-B, the clad material includes a base plate composed of a ferrous material and a Fe atom diffusion suppression layer laminated on the base plate and composed of pure Ni or a Ni-based alloy mainly containing Ni for preventing Fe atoms, which may deteriorate the corrosion resistance, from diffusing into the braze joint from the ferrous material. Further, JA-2003-145290-A proposes a Fe atom diffusion suppressing layer composed of a N—Cr alloy containing Cr in a proportion of not smaller than 10 mass % and not greater than 30 mass % to provide a braze joint of a Cu—N—Cr alloy for improvement of the oxidation resistance and the corrosion resistance of the braze joint.

As described above, the use of the clad material including the Fe atom diffusion suppressing layer improves the corrosion and oxidation resistances of the braze joint of the heat exchanger. In recent years, however, the emission gas cleaning has been more heavily demanded. Correspondingly, the corrosion resistance of the braze joint against emission gas condensate has been more heavily demanded.

SUMMARY OF THE INVENTION

In order to solve the problems described above, preferred embodiments of the present invention provide a brazing method which produces a braze joint having excellent corrosion resistance when members to be joined are brazed to each other, and provide a brazed structure which includes a braze joint having excellent corrosion resistance.

As described in JP-2003-145290-A, the corrosion resistance of the braze joint is improved by the Fe atom diffusion suppressing layer composed of the N—Cr alloy containing Cr. However, if the Ni concentration of the alloy is higher than a certain level, the corrosion resistance is reduced to the contrary. Particularly, this tendency is remarkable under highly corrosive conditions. As a result of intensive studies as to the cause of this tendency, the inventor of the present invention has found that, if the Ni content of the braze joint is increased, dendrite is liable to grow in the braze joint and, therefore, Cu-rich portions (Ni-poor portions) are formed in the braze joint by segregated solidification. The Cu-rich portions are liable to be selectively corroded, so that a passive layer of a Cr oxide film does not effectively function. This deteriorates the corrosion resistance of the braze joint. On the basis of these findings, the inventor has made intensive studies of a method for forming a braze joint that is homogeneous in composition and structure without segregated solidification of the braze joint, thereby accomplishing various preferred embodiments of the present invention.

An inventive brazing method for brazing a first member to be joined to a second member by the intervention of a braze joint formed by fusing and solidifying a brazing material includes the steps of preparing the first member and the brazing material, the first member including a base plate composed of a ferrous material of iron and steel and a diffusion suppressing layer laminated on the base plate for suppressing diffusion of Fe atoms into the braze joint from the base plate during the brazing, the diffusion suppressing layer being composed of a N—Cr alloy essentially including not less than about 15 mass % and not greater than about 40 mass % of Cr, the brazing material being composed of a Cu—Ni alloy essentially including not less than about 10 mass % and not greater than about 20 mass % of Ni, assembling the first and second members into a temporary assembly with the brazing material disposed between the diffusion suppressing layer of the first member and the second member, and performing a brazing process by maintaining the temporary assembly at a temperature of not less than about 1,200° C. to fuse the brazing material and diffuse Ni atoms and Cr atoms into the fused brazing material from the diffusion suppressing layer to form the braze joint, causing the resulting brazing material of the braze joint to have an increased melting point by the diffusion of the Ni atoms and the Cr atoms to self-solidify the braze joint, and then cooling the resulting assembly. The contents of the respective elements are hereinafter simply expressed in units of %. Further, the expression "essentially including" means that other elements may be included as long as the self-solidification, the corrosion resistance and the oxidation resistance of the braze joint are not adversely influenced.

In this brazing method, the temporary assembly including the first and second members with the brazing material disposed between the diffusion suppressing layer of the first member and the second member is maintained at a brazing temperature of not less than about 1,200° C., whereby the brazing material is fused and the Ni atoms and the Cr atoms are diffused into the fused brazing material from the diffusion suppressing layer to form the braze joint. The diffusion of the Ni atoms and the Cr atoms increases the melting point of the brazing alloy of the braze joint over the brazing temperature, whereby the braze joint is self-solidified at the brazing temperature. This phenomenon is referred to as "self-solidification". The self-solidified metal is free from dendrite and, hence, free from segregated solidification. Consequently, the self-solidified metal has a structure such that Ni and Cr are evenly distributed in high concentrations in Cu to form a solid solution. Therefore, the braze joint has excellent corrosion and oxidation resistances.

The brazing material is preferably composed of the Cu—Ni alloy including not less than about 10% and not greater than about 20% of Ni, and the diffusion suppressing layer is composed of the Ni—Cr alloy including not less than about 15% and not greater than about 40% of Cr. Therefore, the concentrations of Ni and Cr in the braze joint can be easily increased at a brazing temperature of not less than about 1200° C., whereby the braze joint is self-solidified. The corrosion resistance of the Cu alloy of the braze joint is improved by the action of Ni, and the surface of the braze joint is coated with a highly corrosion- and oxidation-resistant Cr oxide film formed by the action of Cr. With these actions, the braze joint has excellent corrosion and oxidation resistances.

In the brazing method, the second member, like the first member, may include a base plate made of a ferrous material of an iron and steel, and a diffusion suppressing layer laminated on the base plate. Therefore, it is possible to use the less expensive ferrous material for the base plate of the second member, while preventing the reduction of the corrosion resistance of the braze joint. Stainless steel is preferred as the ferrous material for the base plate because of its high corrosion resistance.

The diffusion suppressing layer is preferably composed of a Ni—Cr alloy including not less than about 30% of Cr. The brazing material preferably has a thickness of not less than about 20 μm and not greater than about 60 μm to ensure that the braze joint can be easily formed as having a Ni content of not less than about 30% and a Cr content of not less than about 10%. Where the thickness of the brazing material is within the aforesaid thickness range, the brazing process can be performed at a brazing temperature of not less than about 1,200° C. and not greater than about 1,250° C. for a brazing period of not shorter than about 30 min and not longer than about 60 min, thereby ensuring higher productivity.

An inventive brazed structure includes first and second members to joined and brazed to each other with the intervention of a braze joint formed by fusing and solidifying a brazing material of a Cu—Ni alloy essentially including not less than about 10 mass % and not greater than about 20 mass % of Ni. The first member includes a base plate preferably made of a ferrous material of an iron and steel and a diffusion suppressing layer laminated on the base plate. The diffusion suppressing layer suppresses diffusion of Fe atoms from the base plate into the braze joint formed on the diffusion suppressing layer during brazing, and is preferably composed of a N—Cr alloy essentially including not less than about 15 mass % and not greater than about 40 mass % of Cr. The braze joint is composed of a Cu—N—Cr alloy including not less than about 30 mass % of Ni and not less than about 10 mass % of Cr and free from segregated solidification.

Since the brazing material is composed of the predetermined Cu—Ni alloy comprising not smaller than 10% of Ni and not greater than 20% of Ni and the diffusion suppressing layer of the first member is composed of the N—Cr alloy comprising not smaller than 15% and not greater than 40% of Cr, the braze joint containing not smaller than 30% of Ni and not smaller than 10% of Cr evenly distributed therein in a solid solution state can be formed by self-solidification without segregated solidification by the brazing at a brazing temperature of not lower than 1200° C. Therefore, the braze joint is excellent in corrosion resistance and oxidation resistance, so that the brazed structure is excellent in durability.

In the brazed structure, the second member includes a base plate preferably composed of a ferrous material of iron and steel and a diffusion suppressing layer laminated on the base plate for suppressing diffusion of Fe atoms into the braze joint from the base plate during the brazing. The diffusion suppressing layer of the second member is preferably composed of a N—Cr alloy essentially including not less than about 15% and not greater than about 40% of Cr. Hence, it is possible to use the less expensive ferrous material for the base plate of the second member, while preventing the reduction of the corrosion resistance of the braze joint. Stainless steel is preferred as the ferrous material for the base plate because of its high corrosive resistance.

In the brazed structure, the first and second members each preferably have a planar center portion and edge portions provided by bending along edges of the planar center portion, and are disposed in opposed relation with the edge portions thereof brazed to each other via the braze joint.

In the brazed structure, a space defined between the first and second members may be used as a flow path for a corrosive fluid. Since the braze joint between the edge portions is excellent in corrosion resistance, the braze joint is less liable to be corroded. Hence, a flow path structure for a heat exchanger can be provided, which suppresses outflow of the corrosive fluid and is less expensive and more excellent in durability. The base plates of the first and second members may be composed of a stainless steel, thereby more improving the durability of the brazed structure.

In the brazed structure, the Ni content of the Cu—N—Cr alloy of the braze joint is preferably not less than about 35%. Thus, the corrosion resistance of the braze joint is further more improved.

In the inventive brazing method, the Ni and Cr contents of the braze joint are increased during the brazing at a brazing temperature of not less than about 1,200° C., whereby the braze joint is self-solidified. Consequently, the braze joint is composed of the Cu—N—Cr alloy homogeneous in structure and composition and free from segregated solidification and, hence, is excellent in corrosion resistance and oxidation resistance. In the inventive brazed structure, the braze joint is preferably composed of the Cu—N—Cr alloy which includes not less than about 30% of Ni and not less than about 10% of Cr and is free from segregated solidification. Therefore, the braze joint has excellent corrosion resistance and oxidation resistance. Thus, the brazed structure has excellent durability.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A brazing method and a brazed structure according to various preferred embodiments of the present invention will hereinafter be described with reference to the attached drawings.

Figure 1:
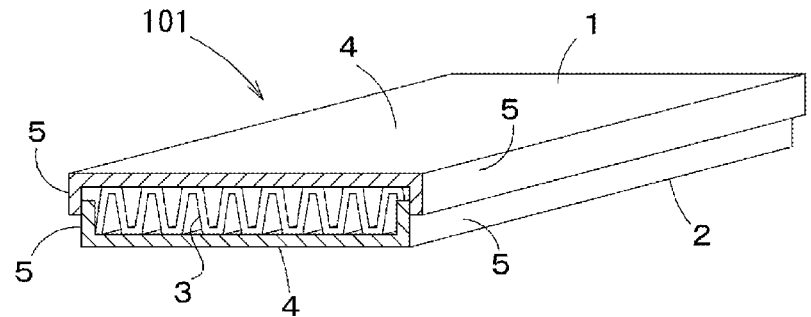
FIG. 1 is a perspective view illustrating, partly in section, a heat exchanger unit according to a preferred embodiment of the present invention.

FIG. 1 illustrates a heat exchanger unit 101 according to a preferred embodiment of the inventive brazed structure. The unit serves as a high temperature gas unit through which a high temperature gas such as emission gas is passed or a cooling unit through which cooling water is passed. The high temperature gas unit and the cooling unit are stacked to provide flow path structures of the heat exchanger.

Figure 2:
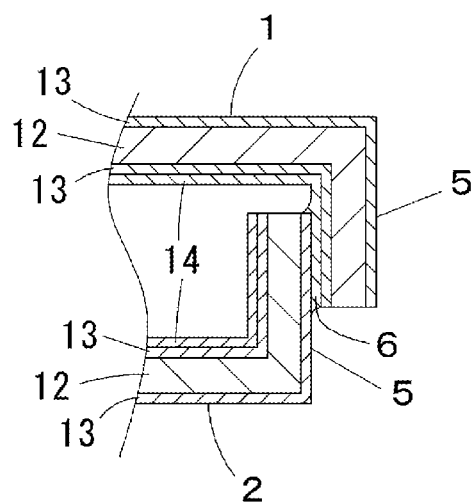
FIG. 2 is an enlarged sectional view illustrating an edge portion of the heat exchanger unit in a brazed state.

The heat exchanger unit 101 preferably includes first and second members 1, 2 to be joined, each having a planar center portion 4 and edge portions 5 provided by bending along opposite edges of the planar center portion 4. The center portions 4 of the first and second members 1, 2 are disposed opposite to each other, and a corrugated fin (partition member) 3 is provided in a space defined between the center portions 4 of the first and second members 1, 2. Outer upper portions of the fin 3 are brazed to a back surface of the center portion 4 of the first member 1, and outer lower portions of the fin 3 are brazed to a back surface of the center portion 4 of the second member 2. Inner surfaces of the edge portions 5 of the first member 1 are respectively brazed to outer surfaces of the edge potions 5 of the second member 2 with the intervention of braze joints 6 as shown in FIG. 2.

The braze joints 6 are each preferably composed of a Cu—N—Cr alloy which includes Cu as a major constituent, Ni in a proportion of not less than about 30%, more preferably not less than about 35%, and Cr in a proportion of not less than about 10%. Furthermore, the alloy for the braze joints is free from dendrite and, hence, free from segregated solidification, and homogenous in structure and composition. Since the braze joints 6 each contain Ni in a proportion of not less than about 30%, the corrosion resistance of the matrix is improved. Further, the braze joints 6 each include Cr in a proportion of not less than about 10%, so that a tight Cr oxide film is formed on surfaces of the braze joints to promote passivation of the surfaces of the braze joints. Thus, the braze joints 6 are excellent in corrosion resistance and oxidation resistance. The brazing method which ensures formation of the braze joints homogenous in structure and composition will be described later. If the segregated solidification occurs in the braze joints, Cu-rich portions will be present in the braze joints, thereby locally reducing the corrosion resistance. Even with passivation films formed on the braze joints in the presence of Cr, the braze joints will have insufficient corrosion resistance in severely corrosive environments. On the contrary, the braze joints 6 according to the present preferred embodiment are free from these disadvantages.

Figure 3:
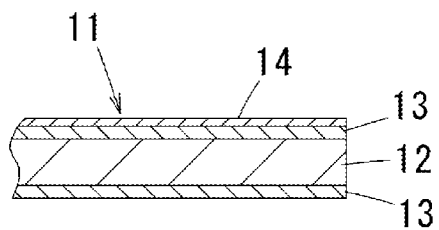
FIG. 3 is a sectional view illustrating a major portion of a clad material for first and second members to be joined.

As shown in FIG. 3, the first and second members 1, 2 are each preferably prepared by working a clad material (i.e., a brazing composite material) 11 including a base plate 12 composed of a stainless steel, diffusion suppressing layers 13 bonded to opposite surfaces of the base plate 12, and a brazing material layer 14 bonded to a surface of one of the diffusion suppressing layers 13. The fin 3 is prepared by bending a stainless steel thin plate into a corrugated shape.

The clad material 11 is typically prepared by roll pressure bonding and diffusion annealing. To be more particular, metal sheets as materials for the base plate and respective layers are stacked and pressure-bonded by rolling, and the resulting pressure-bonded sheet is maintained at a temperature of not less than about 1,000° C. and not higher than 1,100° C. for the diffusion annealing. As required, the clad material is finish-rolled (cold-rolled) for adjustment of the thicknesses of the base plate and the respective layers. After the finish-rolling, the clad material may be annealed as required for softening the clad material. The annealing is preferably carried out in an atmosphere of an inert gas such as nitrogen or argon or a reduction gas such as hydrogen gas for prevention of oxidation of the surfaces of the clad material.

The stainless steel for the base plate 12 of the clad material 11 may preferably be austenite stainless steels such as SUS304 and SUS316 and ferrite stainless steels such as SUS430 and SUS434 specified by JIS. From the viewpoint of workability and corrosion resistance, the austenite stainless steels are preferred. The base plate 12 typically has a thickness of not less than about 300 μm and not greater than about 600 μm, for example.

The diffusion suppressing layers 13 are each preferably composed of a N—Cr alloy essentially including Cr in a proportion of not less than about 15% and not greater than about 40%, preferably not less than about 30% and not greater than about 40%. The brazing material layer 14 is preferably composed of a Cu—Ni alloy essentially including Ni in a proportion of not smaller than about 10% and not greater than about 20%. The N—Cr alloy typically contains the predetermined amount of Cr, and the balance of Ni and inevitable impurities, but an element which improves the characteristic properties of the braze joints may be added to the N—Cr alloy as long as the element does not adversely affect the characteristic properties of the braze joints. The Cu—Ni alloy typically contains the predetermined amount of Ni, and the balance of Cu and inevitable impurities, but an element which improves the characteristic properties of the braze joints may be added to the Cu—Ni alloy as long as the element does not adversely affect the characteristic properties of the braze joints. For example, Al in an amount that is not less than about 1% and not greater than about 5% may be added to the Cu—Ni alloy.

From the viewpoint of suppression of diffusion of Fe atoms, it is sufficient that the diffusion suppressing layers 13 each have a thickness of not less than about 10 μm. In various preferred embodiments of the present invention, however, the diffusion suppressing layers 13 also function to supply Ni atoms and Cr atoms to the braze joints and, therefore, preferably each have a thickness which is not less than the thickness of the brazing material layer 14 and not greater than about 100 μm.

The brazing material layer 14, that is, the brazing material layer at the overlap of the edge portions 5 when brazing the first and second members, preferably has a thickness of not less than about 20 μm and not greater than about 60 μm. If the thickness is less than about 20 μm, the amount of the brazing material is too small, and local deficiency of the brazing material may occur. On the other hand, if the thickness is greater than about 60 μm, the amount of the brazing material is too great, resulting in waste of the brazing material. In addition, where a brazing temperature is not less than about 1,200° C. and not greater than about 1,250° C. and a brazing duration is not shorter than about 30 min and not longer than about 60 min as will be described later, it is difficult to evenly diffuse Ni atoms and Cr atoms into the entire braze joints from the diffusion suppressing layers 13. Therefore, Ni-poor regions and Cr-poor regions occur in the braze joints, thereby reducing the corrosion resistance.

For production of the heat exchanger unit 101, as shown in FIGS. 1 and 2, the second member 2 is fitted in the first member 1 with outer surface portions of the diffusion suppressing layer 13 on the edge portions 5 of the second member 2 kept in contact with inner surface portions of the brazing material layer 14 on the edge portions 5 of the first member 1, and with the fin 3 accommodated in the space defined between the first and second members. Thus, a temporary assembly is provided. The temporary assembly is kept heated at a brazing temperature of not less than about 1,200° C. in an heating oven, and then cooled. As a result, the edge portions 5 of the first member 1 are brazed to the corresponding edge portions 5 of the second member 2, and the fin 3 is brazed to the planar center portions 4 of the first and second members 1, 2. The brazing is preferably carried out in an anti-oxidation atmosphere, for example, in an atmosphere of an inert gas such as nitrogen or argon, in an atmosphere of a reduction gas such as hydrogen gas or in a vacuum atmosphere.

Figure 4:
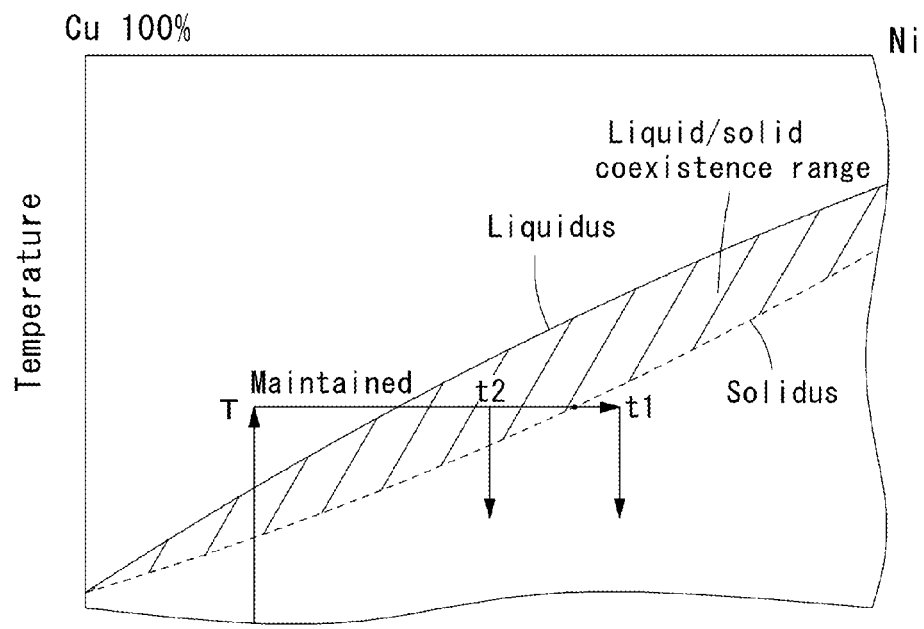
FIG. 4 is an equilibrium phase diagram of a Cu—Ni binary alloy.

Brazing conditions (the brazing temperature and the brazing duration) for brazing the edge portions 5 of the first member 1 to the edge portions 5 of the second member 2 will be explained in detail with reference to FIG. 4.

The brazing material layer (brazing material) 14 held between the diffusion suppressing layers 13 of the edge portions 5 of the first and second members 1, 2 are heated and maintained at a temperature T of not less than about 1,200° C., whereby the brazing material is fused and Ni atoms and Cr atoms are diffused into the fused brazing material from the diffusion suppressing layers 13 to form the braze joints 6 (see FIG. 2). The Ni and Cr concentrations of the braze joints 6 are increased by the diffusion of the Ni atoms and the Cr atoms, so that the resulting brazing material of the braze joints have an increased melting point. Thus, crystallization from a Cu—Ni liquid phase to a Cu—Ni solid phase continuously occurs. When the liquid phase is no longer present, the brazing material is completely self-solidified. And the brazing material is cooled from a time point t1 after the self-solidification. By using such a heating and cooling method, the respective elements are evenly diffused in the solid phase resulting from the continuous crystallization during the self-solidification thereby to be evenly distributed in the braze joints. Therefore, the braze joints 6 are formed to have a homogenous composition and a homogeneous structure without formation of dendrite and, hence, without segregated solidification. If the cooling is started at a time point t2 at which the Cu—Ni is in a solid-liquid coexistent state even when the Cu—Ni is maintained at a temperature of not lower than about 1,200° C., dendrite is liable to grow from the liquid phase. Therefore, Cu-rich portions are formed in the braze joints, so that the braze joints are not homogenous in composition and structure. This reduces the corrosion resistance. Though FIG. 4 shows a Cu—Ni binary phase diagram, where not less than about 30% of Ni is contained in the brazing material, not less than about 10% and not greater than about 20% of Cr easily enters into solid solution with the Ni—Cu solid phase.

The brazing temperature may be not less than about 1,200° C., but preferably not greater than about 1,250° C. If the brazing temperature is less than about 1,200° C., the self-solidification is difficult. This is because it takes too much time for the Ni and Cr contents of the brazing alloy to reach not less than about 30% and not less than about 10%, respectively, by the diffusion of the Ni atoms and the Cr atoms into the braze joints 6 from the diffusion suppressing layer 13. On the other hand, if the brazing temperature is greater than about 1,250° C., a refractory material in an ordinary industrial oven is liable to be severely damaged. In addition, crystal grains of the stainless steel of the base plate tend to become coarse, thereby reducing the strength and the toughness. As the Cr content of the diffusion suppressing layers 13 is increased, the Cr content of the braze joints 6 can be more effectively increased to not less than about 10%. Hence, the Cr content of the diffusion suppressing layer is preferably increased to not less than about 20%, more preferably not less than about 30%. Where the brazing material layer 14 has a thickness of not less than about 20 µm and not greater than about 60 µm and the brazing temperature is not less than about 1200° C. and not greater than about 1250° C., the holding time required for the Ni and Cr contents of the braze joints 6 to reach not less than about 30% and not less than about 10%, respectively, may be not shorter than about 30 min and not longer than about 60 min. These conditions for the brazing ensure excellent industrial productivity.

In this preferred embodiment, the clad material 11 including the diffusion suppressing layers 13 and the brazing material layer 14 laminated on the entire surfaces of the base plate 12 is preferably used for the brazing of the fin 3, but the diffusion suppressing layers and the brazing layer may be laminated only on portions where the first and second members are brazed depending on the application of the product. Further, the brazing material layer 14 is not necessarily required to be laminated on the diffusion suppressing layer 13, but a separately prepared brazing material foil may be placed between the diffusion suppressing layers 13 of the first and second members when the first and second members are assembled.

The inventive brazing method and the inventive brazed structure are advantageously used not only for the aforesaid heat exchanger unit but also for a variety of chemical plants and piping connections utilizing a corrosive fluid. In those cases, the base plate of the brazing composite material may be composed of a carbon steel, a low alloy steel or the like as well as the stainless steel. The second member to be brazed to the first member is not necessarily required to be prepared from the composite material having the same clad structure as the first member in the above-described preferred embodiment, and may be prepared from a plate material composed of a nonferrous metal such as a Ni alloy which is excellent in corrosion resistance.

The present invention will hereinafter be described more specifically by way of examples. However, it should be understood that the present invention is not limited by the following examples.

EXAMPLES

Double layer clad materials (each having a width of about 50 mm, for example) each having a diffusion suppressing layer bonded on a base plate were produced by preparing various composition types of sheets, which correspond to diffusion suppressing layers, the sheets respectively composed of N—Cr alloys containing different amounts of Cr and the balance of Ni as shown in Table 1, and pressure-bonding and diffusion-bonding the sheets onto stainless steel (SUS304) base plates. The clad materials were each finish-rolled for adjustment of the thickness thereof, and then annealed.

Figure 5:
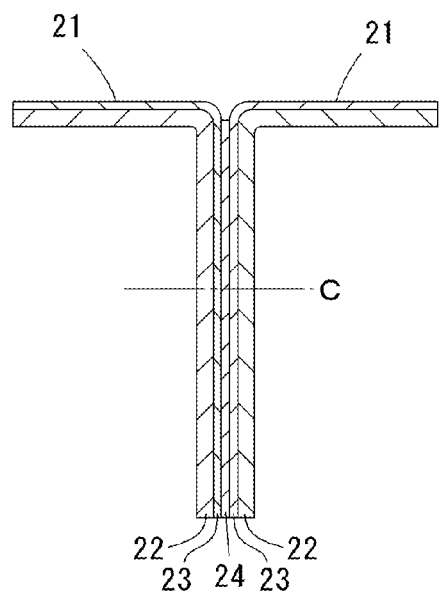
FIG. 5 is a sectional view of a T-shaped brazed part used for a corrosion resistance test.

The clad materials thus prepared were each bent into an L-shape with the diffusion suppressing layer located outward, whereby L-shaped parts were prepared. Then, as shown in FIG. 5, temporary assemblies were respectively prepared by sandwiching different composition types of brazing material foils 24 between the diffusion suppressing layers 23 on the base plates 22 of pairs of such L-shaped parts 21, and then kept heated at brazing temperatures in vacuum for brazing. The brazing material foils 24 were composed of Ni—Cu alloys containing different amounts of Ni and the balance of Cu as shown in Table 1. The Ni contents and thicknesses of the brazing material foils 24 and the Cr contents and thicknesses of the diffusion suppressing layers 23 are collectively shown in Table 1.

Figure 6A:
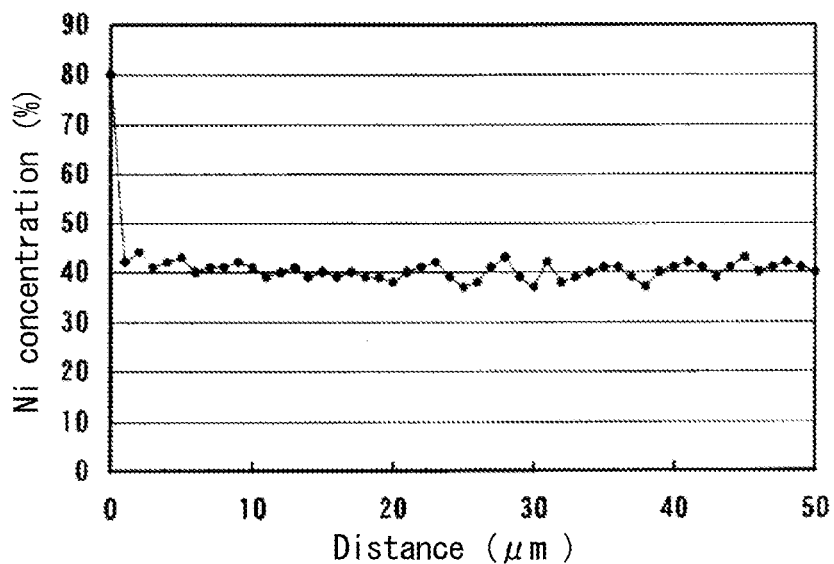
FIGS. 6A and 6B are a couple of graphs and illustrating the results of measurement of a Ni concentration distribution and a Cr concentration distribution, respectively, observed along the thickness of a braze joint of Sample No. 3 (inventive example).
Figure 6B:
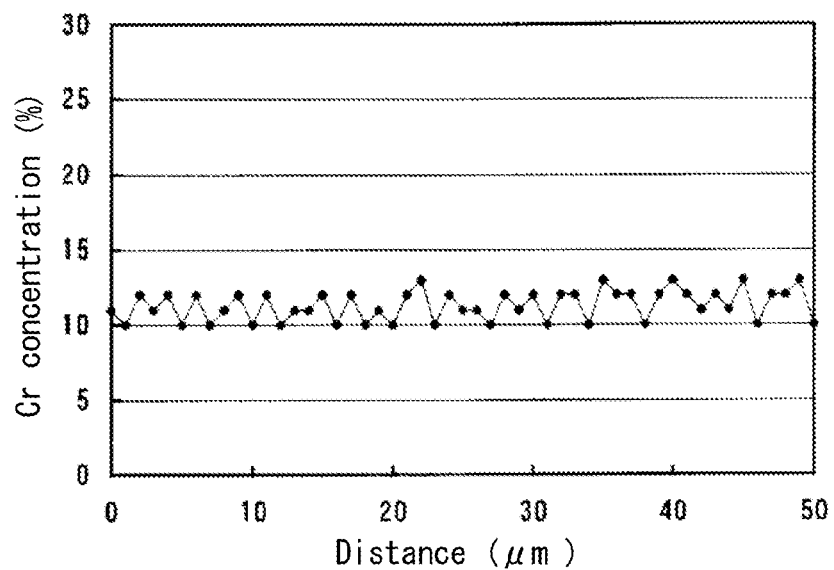
Figure 7A:
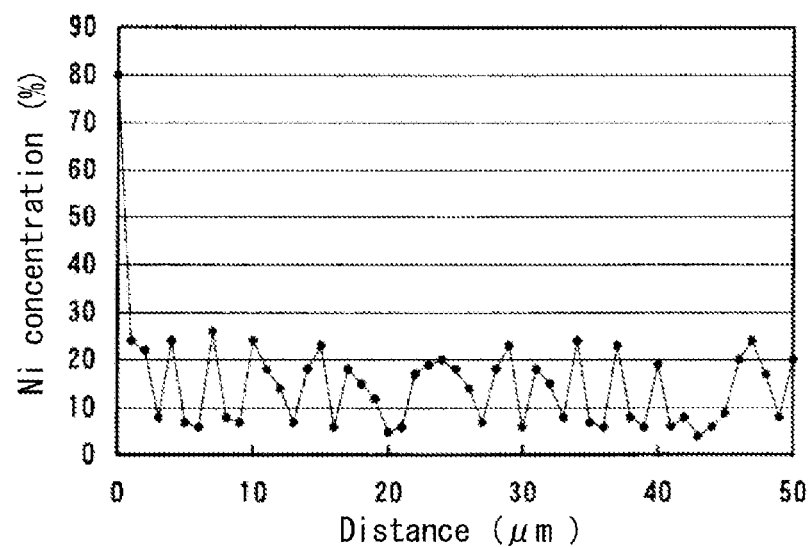
FIGS. 7A and 7B are a couple of graphs and illustrating the results of measurement of a Ni concentration distribution and a Cr concentration distribution, respectively, observed along the thickness of a braze joint of Sample No. 1 (comparative example).
Figure 7B:
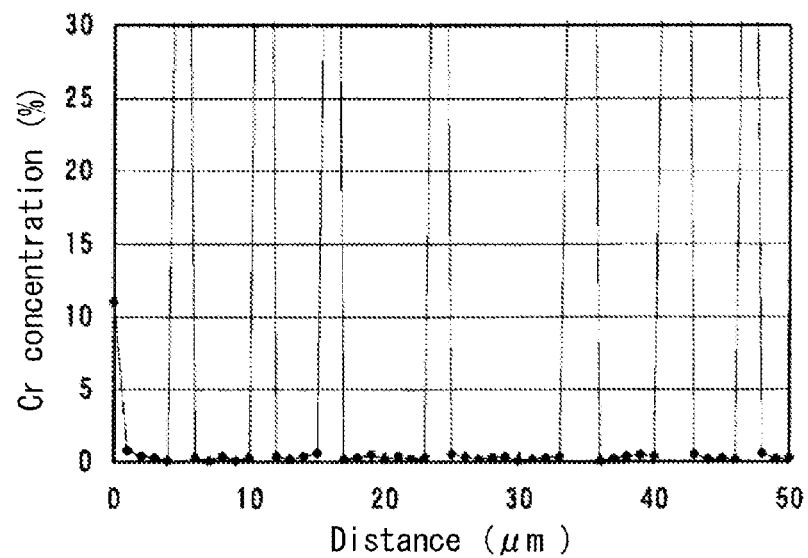

Corrosion test strips were respectively prepared by cutting center portions C of the one-side portions of the T-shaped brazed parts, and the Ni and Cr concentrations of each of the cut portions were measured at intervals of about 1 μm along the thickness of the braze joint from a boundary between the diffusion suppressing layer (intermediate layer) and the braze joint by EPMA. Then, average concentrations and concentration variations (a maximum concentration minus a minimum concentration) were determined. The results of the measurement are also shown in Table 1. Exemplary concentration distributions obtained by the concentration measurement are shown in FIGS. 6A and 6B (Sample No. 3 of an inventive example) and FIGS. 7A and 7B (Sample No. 1 of a comparative example). In FIG. 7B, the Cr concentration is steeply increased at regions in which Cr grains are formed in the braze joint.

Further, a corrosion test was performed by using the respective corrosion test strips. In the corrosion test, a corrosive liquid having the following composition was prepared as simulation emission gas condensate, and the respective test strips were immersed in the corrosive liquid at about 100° C. for approximately 500 hours. Then, the corrosion state of the braze joint exposed in a section of each of the test strips was visually inspected. For evaluation of the corrosion resistance of the exposed section (having a length of about 50 mm) of the braze joint, a test strip free from corrosion was rated at "A (excellent)", and a test strip having a corroded proportion, or a proportion of corroded area (a total length of corroded portions) to the exposed section length, of not greater than about 5% was rated at "B (acceptable)". Further, a test strip having a corroded proportion of greater than about 5% was rated at "C (unacceptable)". The test results are also shown in Table 1.

Composition of the simulation emission gas condensate (pH2.0) Cl$^-$: 20 ppm, NO$_3^-$: 80 ppm, SO$_4^{2-}$: 400 ppm, CH$_3$COO$^-$: 1300 ppm, NH$_4^-$: 300 ppm, HCOO$^-$: 500 ppm

TABLE 1

| Sample No. | Brazing material Ni content (mass %) | Thickness (μm) | Diffusion suppressing layer Cr content (mass %) | Thickness (μm) | Brazing conditions Temperature (° C.) | Time (min) | Braze joint Average concentration (mass %) Ni | Cr | Ni concentration variation range (%) | Cr concentration variation range (%) | Corrosion resistance corroded area (%) | Evaluation | Remarks |
|---|---|---|---|---|---|---|---|---|---|---|---|---|---|
| 1 | 17 | 50 | 20 | 50 | 1180 | 30 | 10 | 2* | 21 | — | 42 | C | Comparative example |
| 2 | 17 | 50 | 20 | 50 | 1200 | 30 | 34 | 10 | 3 | 3 | 3 | B | Inventive example |
| 3 | 17 | 50 | 20 | 50 | 1220 | 30 | 41 | 12 | 5 | 4 | 0 | A | Inventive example |
| 4 | 17 | 50 | 20 | 50 | 1240 | 30 | 44 | 14 | 5 | 3 | 0 | A | Inventive example |
| 5 | 17 | 50 | 20 | 50 | 1250 | 30 | 48 | 17 | 4 | 4 | 0 | A | Inventive example |
| 6 | 17 | 50 | 0 | 50 | 1180 | 30 | 15 | 0 | 25 | — | 83 | C | Comparative example |
| 7 | 17 | 50 | 0 | 50 | 1220 | 30 | 45 | 0 | 4 | — | 74 | C | Comparative example |
| 8 | 17 | 50 | 5 | 50 | 1180 | 30 | 14 | 1* | 13 | — | 84 | C | Comparative example |
| 9 | 17 | 50 | 5 | 50 | 1220 | 30 | 40 | 3 | 5 | 1 | 64 | C | Comparative example |
| 10 | 17 | 70 | 20 | 50 | 1180 | 30 | 8 | 2* | 15 | — | 91 | C | Comparative example |
| 11 | 17 | 70 | 20 | 50 | 1220 | 30 | 18 | 5 | 35 | 1 | 32 | C | Comparative example |
| 12 | 0 | 50 | 20 | 50 | 1220 | 30 | 19 | 8 | 15 | 4 | 18 | C | Comparative example |
| 13 | 0 | 80 | 20 | 50 | 1220 | 30 | 10 | 5 | 17 | 3 | 41 | C | Comparative example |
| 14 | 12 | 50 | 20 | 50 | 1250 | 30 | 39 | 11 | 4 | 1 | 0 | A | Inventive example |
| 15 | 22 | 50 | 20 | 50 | 1250 | 30 | 25 | 8 | 14 | 2 | 24 | C | Comparative example |
| 16 | 17 | 50 | 15 | 50 | 1220 | 10 | 20 | 4 | 15 | 1 | 34 | C | Comparative example |
| 17 | 17 | 50 | 15 | 50 | 1220 | 20 | 25 | 6 | 15 | 2 | 26 | C | Comparative example |
| 18 | 17 | 50 | 35 | 50 | 1220 | 40 | 48 | 15 | 3 | 2 | 0 | A | Inventive example |

Note:
Asterisked average Cr concentrations of braze joints were each calculated with Cr concentrations of Cr grains being excluded.
A notation "—" indicates that the Cr concentration variation range was not calculated.

As can be understood from Table 1, the average Ni content and the average Cr content of each of the braze joints of Samples No. 2, No. 3, No. 4, No. 5, No. 14 and No. 18 of Inventive Examples were increased to not less than 30% and not less than 10%, respectively, though the brazing time was about 30 min or about 40 min, which is relatively short. In addition, the variation ranges of the Ni and Cr concentrations were smaller. Hence, the braze joints were free from segregated solidification attributable to dendrite and homogenous in composition and structure. Therefore, the braze joints were very excellent in corrosion resistance to the highly acidic corrosive liquid having pH2.0.

On the other hand, results of the comparative examples were as follows. The average Ni and Cr concentrations of the braze joint of Sample No. 1 were not sufficiently increased, because the brazing temperature was 1,180° C., which is low. As a result, the braze joint was not self-solidified during the heating, so that segregated solidification of Ni and Cr occurred. Hence, the Ni and Cr concentration variation ranges were relatively great, so that the braze joint was insufficient in corrosion resistance.

The diffusion suppressing layers of Samples No. 6 and No. 7 were composed of pure Ni, so that the braze joints were not passivated in the absence of Cr. Hence, the braze joints were poorer in corrosion resistance. Further, the diffusion suppressing layers of Samples No. 8 and No. 9 were each composed of a N—Cr alloy, but the Cr contents were each about 5%, which is lower. Hence, the average Cr concentrations of the braze joints were each several %, that is, lower, so that the braze joints were poorer in corrosion resistance. Further, Samples No. 6 and No. 8 were produced by the brazing at about 1,180° C., that is, a lower brazing temperature, so that the braze joints suffered from segregated solidification and great variations in composition.

The brazing material layer of Sample No. 11 had a thickness of about 70 μm, so that the distance of the diffusion of Ni and Cr was greater in the brazing at about 1,220° C. for about 30 min. Hence, the variation ranges of the Ni and Cr concentrations of the braze joint were greater, and the average Ni and Cr concentrations were lower. Therefore, the braze joint was poorer in corrosion resistance. Similarly, Sample No. 10 was produced by the brazing at about 1,180° C., that is, a lower brazing temperature, so that the average Cr and Ni concentrations were lower. Therefore, the braze joint was poorer in corrosion resistance.

The brazing materials of Samples No. 12 and No. 13 did not contain Ni, so that the self-solidification did not occur in the brazing at a brazing temperature of about 1,220° C. Further, the braze joints each had a reduced Ni concentration. With the reduced Ni concentration, the amount of Cr in the solid solution was also reduced. As a result, the braze joints were poorer in corrosion resistance. On the other hand, the Ni content of the brazing material of sample No. 15 was about 22%, which is higher, so that a brazing temperature of about 1,250° C. was too low to positively diffuse Ni atoms and Cr atoms into the braze joint from the diffusion suppressing layer for the self-solidification. Hence, the average Ni and Cr concentrations of the braze joint were lower and, therefore, the braze joint was poorer in corrosion resistance.

As for Samples No. 16 and No. 17, the brazing durations of approximately 10 min and 20 min, respectively at a brazing temperature of about 1,220° C. were too short for the braze joints to be self-solidified, thus suffering from segregated solidification. Further, the average Ni and Cr contents were not increased, so that the braze joints were poorer in corrosion resistance. Samples No. 1, No. 8 and No. 10 which were produced by the brazing at about 1,180° C., that is, a lower brazing temperature suffered from segregated solidification. Further, the average Ni contents were lower and the amounts of Cr in the solid solution were correspondingly lower, so that Cr grains grew. Hence, the braze joints locally had Cr-rich portions but, as a whole, the Ni and Cr concentrations were lower. Therefore, the braze joints were insufficiently passivated by Cr, and generally poorer in corrosion resistance.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A brazed structure comprising:
   a first member;
   a second member;
   a braze joint joining the first member and second member to each other, the braze joint being made of a fused brazing material of a Cu—Ni alloy consisting essentially of not less than about 17 mass % and not greater than about 20 mass % of Ni and the balance of Cu; wherein
   the first member includes a base plate made of a ferrous material and a diffusion suppressing layer laminated on the base plate, and the diffusion suppressing layer being arranged to suppress diffusion of Fe atoms from the base plate into the braze joint disposed on the diffusion suppressing layer during brazing and being made of a Ni—Cr alloy consisting essentially of not less than about 15 mass % and not greater than about 40 mass % of Cr and the balance of Ni;
   the braze joint is made of a Cu—Ni—Cr alloy being formed by self-solidification, consisting essentially of not less than about 34 mass % of Ni and not less than 10 mass % of Cr and the balance of Cu and being free from segregated solidification.

2. The brazed structure as set forth in claim 1, wherein the second member includes a base plate made of a ferrous material and a diffusion suppressing layer laminated on the base plate for suppressing diffusion of Fe atoms into the braze joint from the base plate during the brazing, and the diffusion suppressing layer of the second member is made of a Ni—Cr alloy consisting essentially of not less than about 15 mass %, not greater than about 40 mass % of Cr, and the balance of Ni.

3. The brazed structure as set forth in claim 2, wherein the base plates of the first member and the second member are each made of a stainless steel.

4. The brazed structure as set forth in claim 3, wherein the first and second members each have a planar center portion and edge portions defined by bending edges along a planar center portion thereof, and are disposed in opposed relation with the edge portions thereof brazed to each other via the braze joint.

5. The brazed structure as set forth in claim 1, wherein the Cu—Ni—Cr alloy of the braze joint has a Ni content of not less than about 35 mass %.

6. A heat exchanger comprising the brazed structure as set forth in claim 1.

* * * * *